(12) United States Patent
Wong et al.

(10) Patent No.: US 6,842,056 B1
(45) Date of Patent: Jan. 11, 2005

(54) CASCADED PHASE-LOCKED LOOPS

(75) Inventors: Keng L. Wong, Portland, OR (US);
Cangsang Zhao, Portland, OR (US);
Chee How Lim, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/603,722

(22) Filed: Jun. 24, 2003

(51) Int. Cl.[7] ............................................... H03L 7/06
(52) U.S. Cl. ..................................... 327/147; 327/156
(58) Field of Search ................................ 327/147, 155, 327/154, 156, 162, 163; 331/11, 25; 375/373, 375, 376

(56) References Cited

U.S. PATENT DOCUMENTS

| | | | | |
|---|---|---|---|---|
| 4,577,241 A | * | 3/1986 | Wilkinson | 386/124 |
| 6,112,308 A | | 8/2000 | Self et al. | 713/400 |
| 6,218,876 B1 | * | 4/2001 | Sung et al. | 327/156 |
| 6,320,424 B1 | | 11/2001 | Kurd et al. | 327/157 |
| 6,329,882 B1 | | 12/2001 | Fayneh et al. | 331/17 |
| 6,433,599 B2 | * | 8/2002 | Friedrich et al. | 327/165 |
| 6,636,575 B1 | * | 10/2003 | Ott | 375/376 |

OTHER PUBLICATIONS

N. Kurd, et al., "Multi–GHz Clocking Scheme for Intel Pentium 4 Microprocessor," ISSCC Digest of Technical Papers, 2001.

S. Rusu, et al., "Clock Generation and Distribution for the First IA–64 Microprocessor," ISSCC Disgest of Technical Papers, 2000.

R. Kuppuswamy, et al., "On–die Clock Jitter Detector for High–speed Microprocessors," VLSI Symposium Digest of Technical Papers, 2001.

J. Maneatis, "Low–Jitter Process–Independent DLL and PLL Based on Self–Biased Techniques," IEEE J. Solid– State Circuits, vol. 31, No. 11, pp. 1723–1732, Nov. 1996.

* cited by examiner

Primary Examiner—Linh My Nguyen
(74) Attorney, Agent, or Firm—Schwabe, Williamson & Wyatt, P.C.

(57) ABSTRACT

A method and apparatus for generating clock frequencies using cascaded phase-locked loop (PLL) circuits includes a first PLL circuit coupled to a second PLL circuit to produce a microprocessor I/O data clock signal and a microprocessor core clock signal, respectively. In one embodiment, the first PLL produces the data clock signal based upon a first reference signal and a first feedback signal, where the first feedback signal is derived from the data clock signal. Furthermore, the second PLL circuit produces the core clock signal based at least in part upon a second reference signal and a second feedback signal, where the second reference signal is derived from the data clock signal and the second feedback signal is derived from the core clock signal.

15 Claims, 4 Drawing Sheets

CASCADED PHASE-LOCKED LOOPS

BACKGROUND OF THE INVENTION

1. Field of the Invention

Embodiments of the present invention relate to the field of circuit design. More specifically, embodiments of the present invention relates to a cascaded PLL arrangement.

2. Background Information

Over the years, ongoing advancements in the field of microprocessor design and fabrication have facilitated the continued increase in microprocessor clock frequencies. High frequency microprocessor core clocks are typically synthesized from existing, lower frequency external reference clocks such as a bus clock. In the past, it was fairly simple to achieve a desired core frequency using PLLs as microprocessor core-to-bus frequency ratios were relatively low. Nowadays however, in order to generate the multi-Gigahertz microprocessor core frequencies that are typical, a large PLL synthesis factor is required. Unfortunately, as PLL synthesis factors increase, the circuit area required to implement the PLLs also increases.

In the past, microprocessor core clock signals and microprocessor I/O clock signals have been generated by two PLLs disposed in a parallel arrangement with respect to one another. FIG. 1, for example, illustrates a prior art dual-PLL arrangement where the PLLs are arranged in a parallel configuration. As shown, the external reference clock, xclk, is routed to both I/O PLL 104 and Core PLL 114 to generate Data clock 109 and Core clock 119 respectively. In order to generate a Core clock signal having a frequency that is N times greater than the frequency of xclk, the damping factor (which is a measure of PLL stability) of Core PLL 114 is reduced by a factor equivalent to the square root of N. One problem with this arrangement, however, is that a lower damping factor can also cause jitter amplification in certain phase-modulation frequencies. Additionally, any phase noise associated with xclk will be propagated through to Core clock 119 with only one level of filtering. Moreover, since the bandwidth of Core PLL 114 is very high, the effectiveness of the phase noise filtering is reduced.

Another problem associated with the parallel PLL configuration illustrated in FIG. 1 involves the synchronous transfers between timing domains. Because the parallel PLLs do not track each other very closely, a timing margin is often required to facilitate synchronous data transfer from one timing domain to another in a deterministic manner. Unfortunately, however, such timing margins typically shrink as microprocessor core operating frequencies increase potentially resulting in clock instability.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF EMBODIMENTS OF THE INVENTION

A method and apparatus for generating clock frequencies using cascaded phase locked loops (PLL) is described. In the following detailed description, numerous specific details are set forth in order to provide a thorough understanding of the present invention. However, those skilled in the art will understand that the present invention may be practiced without these specific details, that the present invention is not limited to the depicted embodiments, and that the present invention may be practiced in a variety of alternative embodiments. In other instances, well known methods, procedures, components, and circuits have not been described in detail.

Various operations will be described as multiple discrete steps performed in turn in a manner that is helpful for understanding the present invention. However, the order of description should not be construed as to imply that these operations are necessarily performed in the order they are presented, nor even order dependent.

Reference throughout this specification to "one embodiment" or "an embodiment" means that a particular feature, structure, or characteristic described in connection with the embodiment is included in at least one embodiment of the invention. Thus, the appearances of the phrases "in one embodiment" or "in an embodiment" in various places throughout this specification are not necessarily all referring to the same embodiment or invention. Furthermore, the particular features, structures, or characteristics may be combined in any suitable manner in one or more embodiments. Lastly, the terms "comprising", "including", "having", and the like, as used in the present application, are intended to be synonymous.

Figure 1:
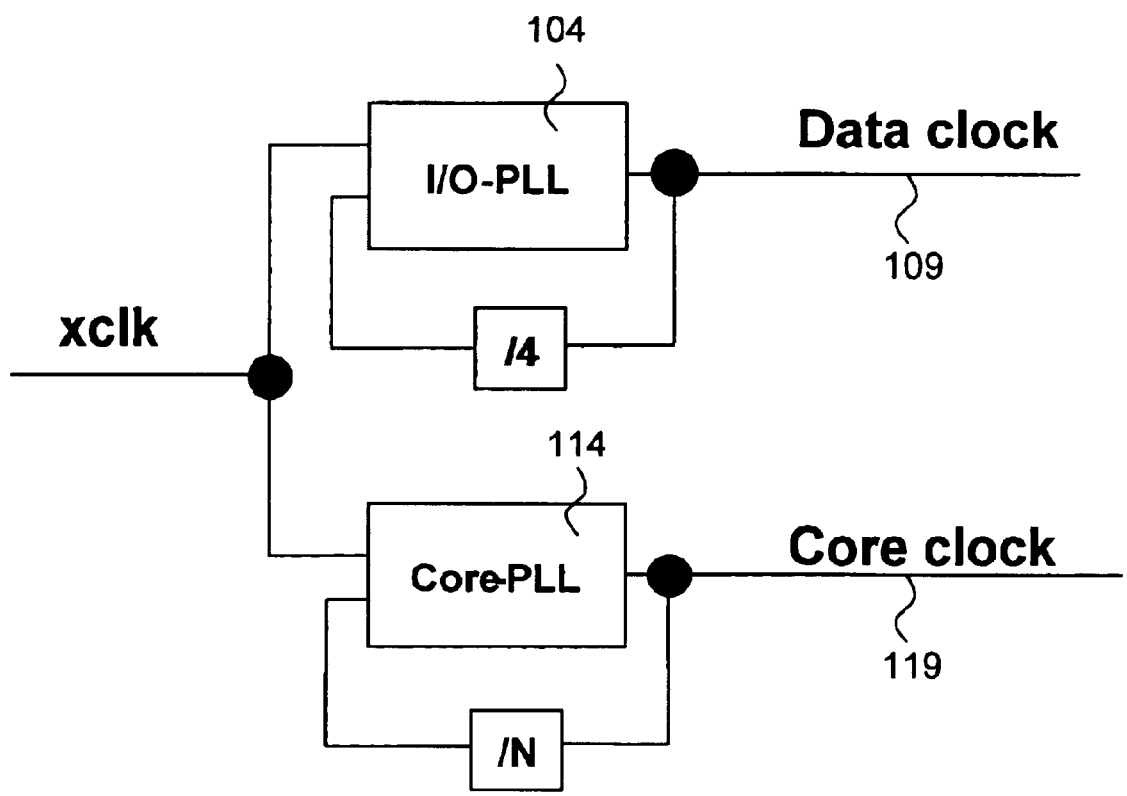
FIG. 1 illustrates a first and second PLLs disposed in a parallel relationship according to the prior art.
Figure 2:
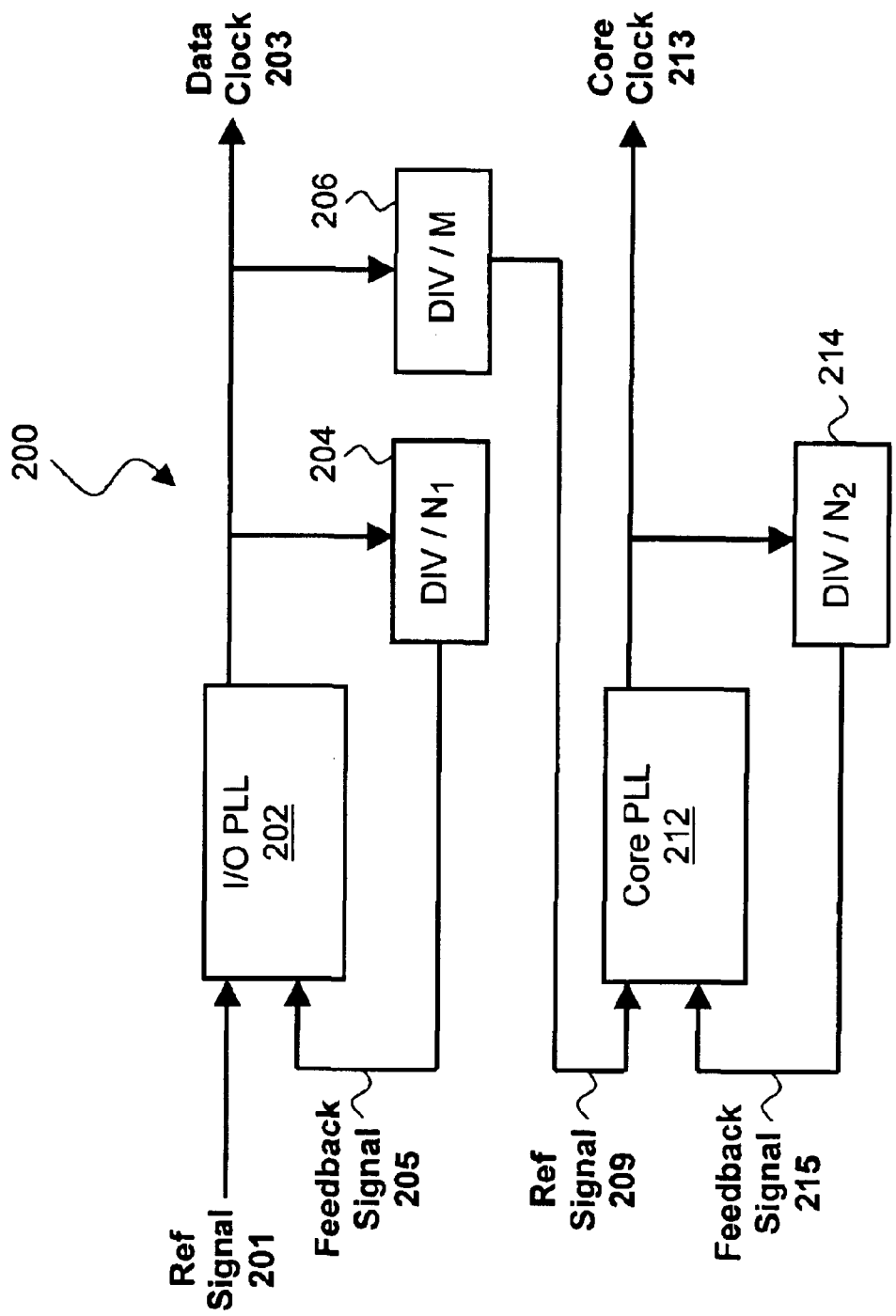
FIG. 2 illustrates clock generation circuitry utilizing cascaded PLLs in accordance with one embodiment of the invention.

FIG. 2 illustrates clock generation circuitry utilizing cascaded PLLs in accordance with one embodiment of the invention. As shown, clock generation circuitry 200 includes I/O PLL 202 coupled to core PLL 212 in a cascaded manner, as shown. In particular, I/O PLL 202 receives reference signal 201, and in turn generates data clock signal 203. Data clock signal 203, or a divided down version of data clock signal 203, is then used as a reference clock signal for core PLL 212 which in turn generates core clock 213. In one embodiment, data clock signal 203 is used for source synchronous communication between a microprocessor and its memory subsystem, whereas core clock 213 is utilized by the microprocessor core.

In addition to I/O PLL 202 and core PLL 212, clock generation circuitry 200 further includes feedback frequency dividers 204, 206 and 214. Each of feedback frequency dividers 204, 206 and 214 represent circuitry to divide the frequency of an input signal by an integer value to produce an output signal having a reduced or "divided-down" frequency as compared to an input signal. More specifically, in the illustrated embodiment, feedback frequency divider 204 generates feedback signal 205 based upon data clock signal 203, feedback frequency divider 206 generates reference signal 209 based upon data clock signal 203, and feedback frequency divider 214 generates reference signal 215 based upon core clock signal 213. In one embodiment, one or more of feedback frequency dividers 204, 206 and 214 are selectively programmable so as to divide the frequency of an input signal by a selected factor. In one embodiment, feedback frequency divider 206 may be selectively programmed to divide the frequency of data clock signal 203 by a factor of 4, 2 or 1. Similarly, in one embodiment, feedback frequency divider 214 may be programmed to divide the frequency of core clock signal 213 by an integer value selected from a group of integer values including a low integer value, and a high integer value that is less than two times the low integer value. In one embodiment, feedback frequency divider 214 may be programmed to divide the frequency of core clock signal 213 by an integer value that is greater than or equal to 12 and less than or equal to 23. For example, if feedback frequency divider 206 is set to divide data clock signal 203 by 1, 2 or 4, the effective synthesis factor range of clock generation circuitry 200 would be 12–23, 2446 and 48–92, respectively.

By selecting a higher multiplied input reference frequency for the Core PLL, its output frequency can be ratcheted up to reach a higher synthesis multiplication factor. Because the Core PLL's ratio range is small, its damping factor fits in a tight design range, and the filter capacitor required to stabilize the Core PLL can be minimized. Since the implementation area of a PLL is largely dependent upon the total capacitance of the PLL, a cascaded PLL arrangement facilitates leveraging a wide synthesis range while reducing the overall PLL implementation size. Moreover, the cascaded arrangement of I/O PLL 202 and core PLL 212 provides an additional level of filtering of external reference clock phase noise not available in single PLL implementations.

Figure 3:
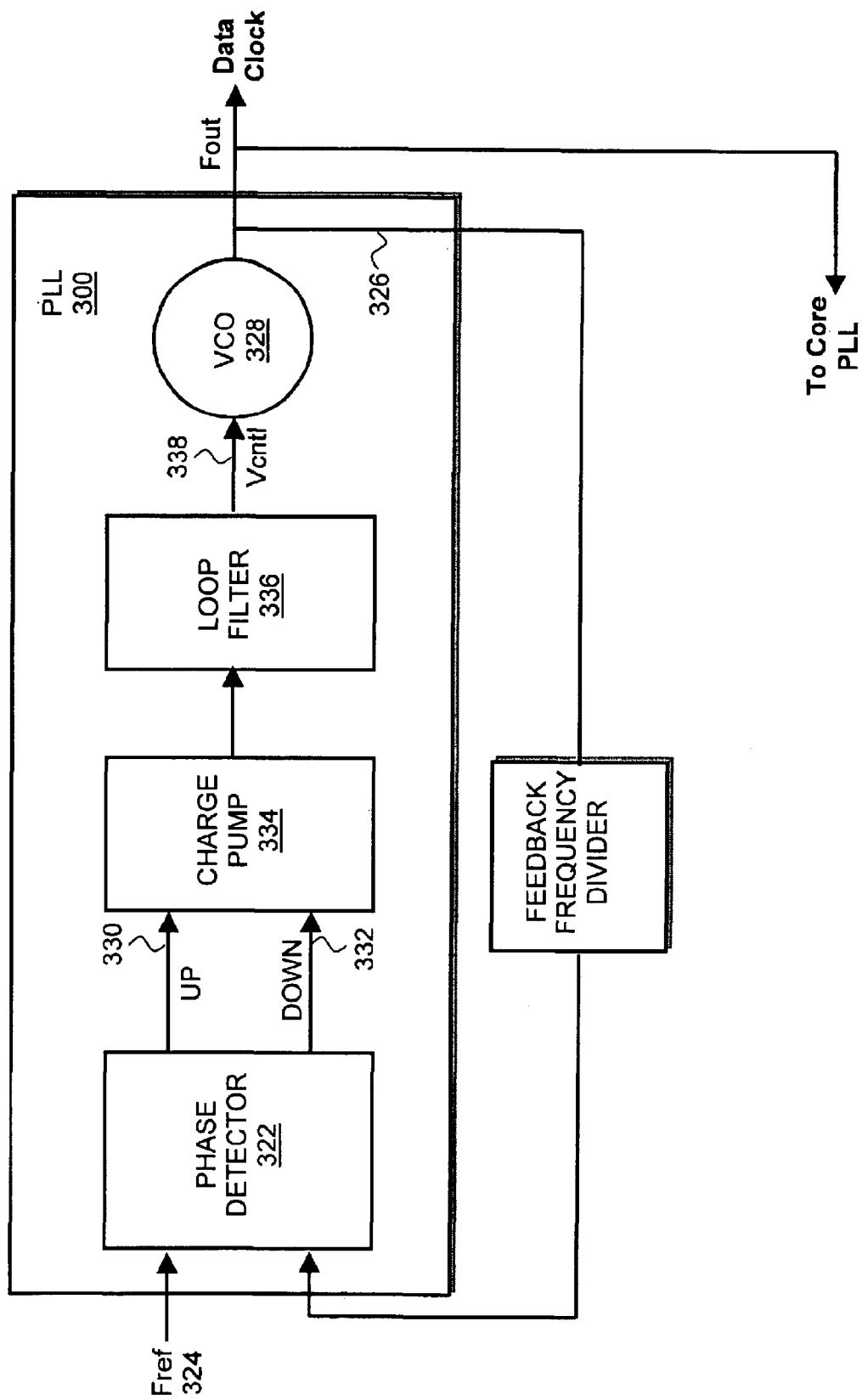
FIG. 3 illustrates an example PLL suitable for cascading with one or more additional PLLs in accordance with one embodiment of the invention.

FIG. 3 illustrates an example PLL suitable for cascading with one or more additional PLLs in accordance with one embodiment of the invention. As shown, PLL 300, includes phase-frequency detector (PFD) 322 for monitoring a phase difference between a reference signal 324 and a feedback signal 326 (in the form of a frequency divided output signal of a voltage-controlled oscillator (VCO 328). The PFD 322 generates an UP control signal 330 and a DOWN control signal 332 to cause a charge pump 334 to respectively charge and discharge a loop filter 336. The loop control voltage 338 developed across the loop filter 336 determines the output frequency of the VCO 328. Furthermore, the UP and DOWN control signals 330, 332 that drive the charge pump 334 set the proper loop filter control voltage 338 at the input of the VCO to maintain a minimal phase error between the input signals applied to the PFD 322.

During lock acquisition, the PFD attempts to correct for frequency differences and/or phase misalignments between the reference and feedback clocks 324, 326. The correction comes in the form of the UP/DOWN control signals 330, 332 whose pulse-widths are proportional to the frequency and/or phase error between the two input signals. The pulse width of the UP/DOWN control signals 330, 332 informs the charge-pump as to how much current to source or sink from loop filter capacitors.

Figure 4:
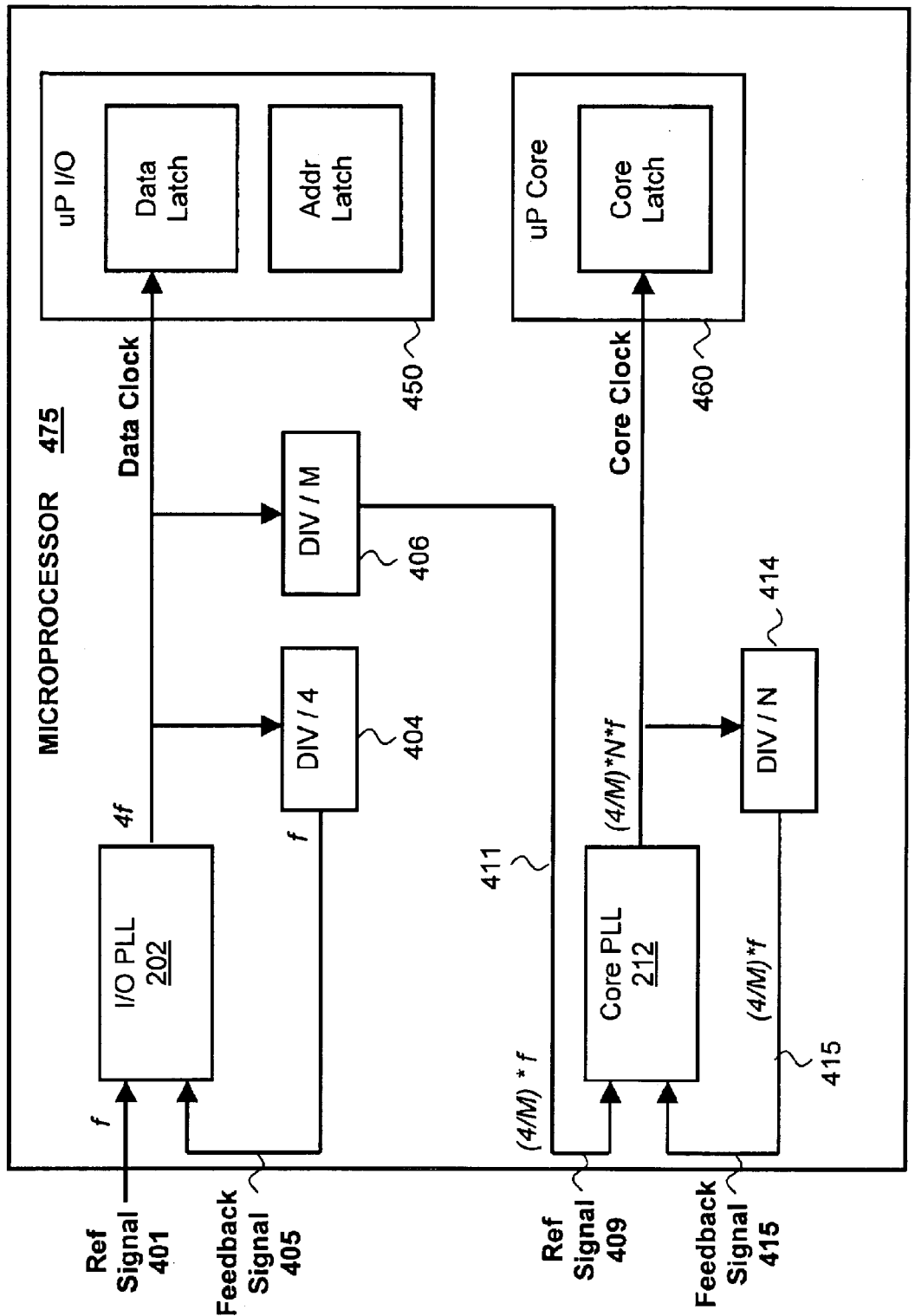
FIG. 4 illustrates one embodiment of a microprocessor including the cascaded PLL clock generation circuitry of FIG. 2.

FIG. 4 illustrates one embodiment of a microprocessor including the cascaded PLL clock generation circuitry of FIG. 2. In the illustrated embodiment of FIG. 4, microprocessor 475 includes I/O PLL 202 and core PLL 212 coupled together in a cascaded manner as shown. In one embodiment, the data clock signal generated from I/O PLL 202 is used by I/O block 450 of microprocessor 475 to facilitate data and address latching within a first time domain, while the core clock signal generated from core PLL 212 is used by core block 460 of microprocessor 475 to facilitate latching in a second time domain. However, because the cascaded PLL arrangement of FIGS. 2 and 4 facilitates tight tracking between the two clock domains, a reduced timing margin between the domains may be achieved. In one embodiment, the loop bandwidth of core PLL 212 is at least three times greater than the loop bandwidth of I/O PLL 202.

Although it may not be readily apparent from FIG. 4, signal path 411 which provides reference signal 409 to PLL 212, and signal path 415 which provides feedback signal 415 to PLL 212 may be associated with long distributions. In one embodiment, to reduce the impact of global supply noise that may occur due to the long signal distributions, signal path 411 and signal path 415 are equalized in length so as to provide first-order common mode tracking.

Epilog

While the present invention has been described in terms of the above-illustrated embodiments, those skilled in the art will recognize that the invention is not limited to the embodiments described. For example, the PLL of FIG. 2 may be used in one or more chipsets in addition to the microprocessor of FIG. 4. The present invention can be practiced with modification and alteration within the spirit and scope of the appended claims. Thus, the description is to be regarded as illustrative instead of restrictive on the present invention.

What is claimed is:

1. A circuit comprising:
a first phase-locked loop to receive a first reference signal and a first feedback signal, and to produce a data clock signal having a first frequency based at least in part upon the first reference signal and the first feedback signal; and
a second phase-locked loop coupled to the first phase-locked loop by a first signal path, the second phase-locked loop to receive a second reference signal on the first signal path and a second feedback signal on a second signal path and to produce a second clock signal having a second frequency based at least in part upon the second reference signal and the second feedback signal, the first feedback signal and the second reference signal being derived from the data clock signal and the second feedback signal being derived from the second clock signal, wherein the second reference signal and the second feedback signal have equivalent signal distribution delays.

2. The circuit of claim 1, further comprising a first divide-by-N circuit coupled to the first phase-locked loop circuit to divide the first frequency of the data clock signal by a first integer value N to produce the first feedback signal having a third frequency.

3. The circuit of claim 2, further comprising a divide-by-M circuit coupled between the first phase-locked loop circuit and the second phase-locked loop circuit to divide the first frequency of the data clock signal by an integer value M to produce the second reference signal.

4. The circuit of claim 3, wherein the divide-by-M circuit is equipped to divide the first frequency of the data clock signal by a selected one of a factor of 4, 2 and 1.

5. The circuit of claim 4, wherein the first divide-by-N circuit comprises a divide-by-4 circuit to divide the first frequency of the data clock signal by a factor of 4.

6. The circuit of claim 3, further comprising a second divide-by-N circuit coupled to the second pase-locked loop to divide the second frequency of the second clock signal by a second integer value N to produce the second feedback signal, wherein the second integer value N is selected from a group of integer values including a low integer value, and a high integer value that is less than two times the low integer value.

7. The circuit of claim 1, wherein
the first signal path corresponding to the second reference signal; and
the second signal path corresponding to the second feedback signal, are equivalent in length.

8. A processor comprising:

a processing core;

input-output circuitry;

a first phase-locked loop coupled to the input-output circuitry by a first signal trace, the first phase-locked loop producing a first output signal having a first frequency based at least in part upon a first reference signal and a first feedback signal derived from the first output signal, and providing the first output signal as a data clock signal to the input-output circuitry on the first signal trace; and a second phase-locked loop coupled to the first phase-locked loop by a second signal trace and to the processor core circuitry by a third signal trace, the second phase-locked loop providing a second output clock signal to the processor core circuitry on the third signal trace, the second output signal having a second frequency based at least in part upon a second reference signal provided by the second signal trace and derived from the first output signal and a second feedback signal derived from the second output signal.

9. The processor of claim 8, further comprising a first divide-by-N circuit coupled to the first phase-locked loop to divide the first frequency of the data clock signal by a first integer value N to produce the first feedback signal having a third frequency.

10. The processor of claim 9, further comprising a divide-by-M circuit coupled between the first Phase-locked loop and the second Phase-locked loop to divide the first frequency of the data clock signal by an integer value M to produce the second reference signal.

11. The processor of claim 10, wherein the divide-by-M circuit is equipped to divide the first frequency of the data clock signal by a selected one of a factor of 4, 2 and 1.

12. The processor of claim 11, wherein the first divide-by-N circuit comprises a divide-by-4 circuit to divide the first frequency of the data clock signal by a factor of 4.

13. The processor of claim 10, further comprising a second divide-by-N circuit coupled to the second phase-locked loon to divide the second frequency of a core clock signal by a second integer value N to produce the second feedback signal, wherein the second integer value N is selected from a group of integer values including a low integer value and a high integer value that is less than two times the low integer value.

14. The processor of claim 8, further comprising:

fourth signal trace to provide the second feedback signal, wherein the second and fourth signal traces have equivalent signal distribution delays.

15. The processor of claim 14, wherein the second and fourth signal traces are equivalent in length.

* * * * *

UNITED STATES PATENT AND TRADEMARK OFFICE
CERTIFICATE OF CORRECTION

PATENT NO. : 6,842,056 B1
APPLICATION NO. : 10/603722
DATED : January 11, 2005
INVENTOR(S) : Wong et al.

Page 1 of 1

It is certified that error appears in the above-identified patent and that said Letters Patent is hereby corrected as shown below:

Column 4,
Line 56, "...pase-locked loop" should read -- ...phase-locked loop --;
Line 63, "...Claim 1, wherein" should read -- ...Claim 1, wherein: --;
Line 67, "...signal, are..." should read -- ...signal are... --;

Column 6,
Lines 2 and 3, "...Phase-locked" should read -- ...phase-locked --; and
Line 14, "locked loon..." should read -- locked loop... --.

Signed and Sealed this

Twenty-seventh Day of June, 2006

JON W. DUDAS
*Director of the United States Patent and Trademark Office*